(12) United States Patent
Kuwabara et al.

(10) Patent No.: US 12,745,660 B2
(45) Date of Patent: Sep. 22, 2026

(54) WIRING SUBSTRATE

(71) Applicant: IBIDEN CO., LTD., Ogaki (JP)

(72) Inventors: Masashi Kuwabara, Ibi-gun (JP); Jun Sakai, Ogaki (JP); Shiho Shimada, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 236 days.

(21) Appl. No.: 18/626,736

(22) Filed: Apr. 4, 2024

(65) Prior Publication Data

US 2024/0339388 A1 Oct. 10, 2024

(30) Foreign Application Priority Data

Apr. 5, 2023 (JP) ................................ 2023-061717

(51) Int. Cl.
*H10W 70/685* (2026.01)
*H10W 70/05* (2026.01)
*H10W 70/65* (2026.01)
*H10W 70/69* (2026.01)

(52) U.S. Cl.
CPC ......... *H10W 70/685* (2026.01); *H10W 70/05* (2026.01); *H10W 70/65* (2026.01); *H10W 70/69* (2026.01)

(58) Field of Classification Search
CPC ... H10W 70/685; H10W 70/65; H10W 70/05; H10W 70/69
See application file for complete search history.

(56) References Cited

U.S. PATENT DOCUMENTS

| | | | | |
|---|---|---|---|---|
| 2017/0103943 | A1* | 4/2017 | Hu | H01L 23/49822 |
| 2017/0309558 | A1* | 10/2017 | Kajihara | H01L 23/49822 |
| 2021/0066144 | A1* | 3/2021 | Fu | H01L 22/32 |
| 2022/0369457 | A1* | 11/2022 | Kawai | H05K 3/4644 |

FOREIGN PATENT DOCUMENTS

| | | |
|---|---|---|
| JP | 2005-005341 A | 1/2005 |

* cited by examiner

*Primary Examiner* — Pete T Lee
(74) *Attorney, Agent, or Firm* — Finnegan, Henderson, Farabow, Garrett & Dunner, LLP

(57) ABSTRACT

A wiring substrate includes a first build-up part including an insulating layer and a conductor layer, and a second build-up part including an insulating layer and a conductor layer. The minimum wiring width of wirings in the conductor layer of the first build-up part is smaller than the minimum wiring width of wirings in the conductor layer of the second build-up part. The minimum inter-wiring distance of the wirings in the first part is smaller than the minimum inter-wiring distance of the wirings in the second part. The first build-up part is formed such that the conductor layer includes a conductor pattern including a first metal layer, a second metal layer, and a third metal layer. The width of the first metal layer is larger than the width of the second metal layer. The width of the third metal layer is larger than the width of the first metal layer.

20 Claims, 8 Drawing Sheets

1
10
20
30
12a
11
12
22a
21
22
31
32
33
31a
32p
40
41
23
Ea1
Ea2
E1
E2
13
13a
12p
10F
II
1F
20F
10B
23a
20B
1B

θ1
S12
P
T
S3
W11
W12
θ2
123
122
121
W13
N
12w
120
51a
51
51b
5
12v
N
52
11a
110
13b
110a
52a
121
122
123
13
13a
L
11
11
10
12
X
Z

WIRING SUBSTRATE

CROSS-REFERENCE TO RELATED APPLICATIONS

The present application is based upon and claims the benefit of priority to Japanese Patent Application No. 2023-061717, filed Apr. 5, 2023, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2005-5341 describes a method for manufacturing a printed wiring board using a semi-additive method including copper etching. The entire contents of this publication are incorporated herein by reference.

SUMMARY OF THE INVENTION

According to one aspect of the present invention, a wiring substrate includes a first build-up part including an insulating layer and a conductor layer, and a second build-up part including an insulating layer and a conductor layer and formed such that the first build-up part is laminated on the second build-up part, the minimum wiring width of wirings in the conductor layer of the first build-up part is smaller than the minimum wiring width of wirings in the conductor layer of the second build-up part, and the minimum inter-wiring distance of the wirings in the conductor layer of the first build-up part is smaller than the minimum inter-wiring distance of the wirings in the conductor layer of the second build-up part. The first build-up part is formed such that the conductor layer includes a conductor pattern including a first metal layer, a second metal layer laminated on the first metal layer, and a third metal layer laminated on the second metal layer, a width of the first metal layer is larger than a width of the second metal layer, and a width of the third metal layer is larger than the width of the first metal layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
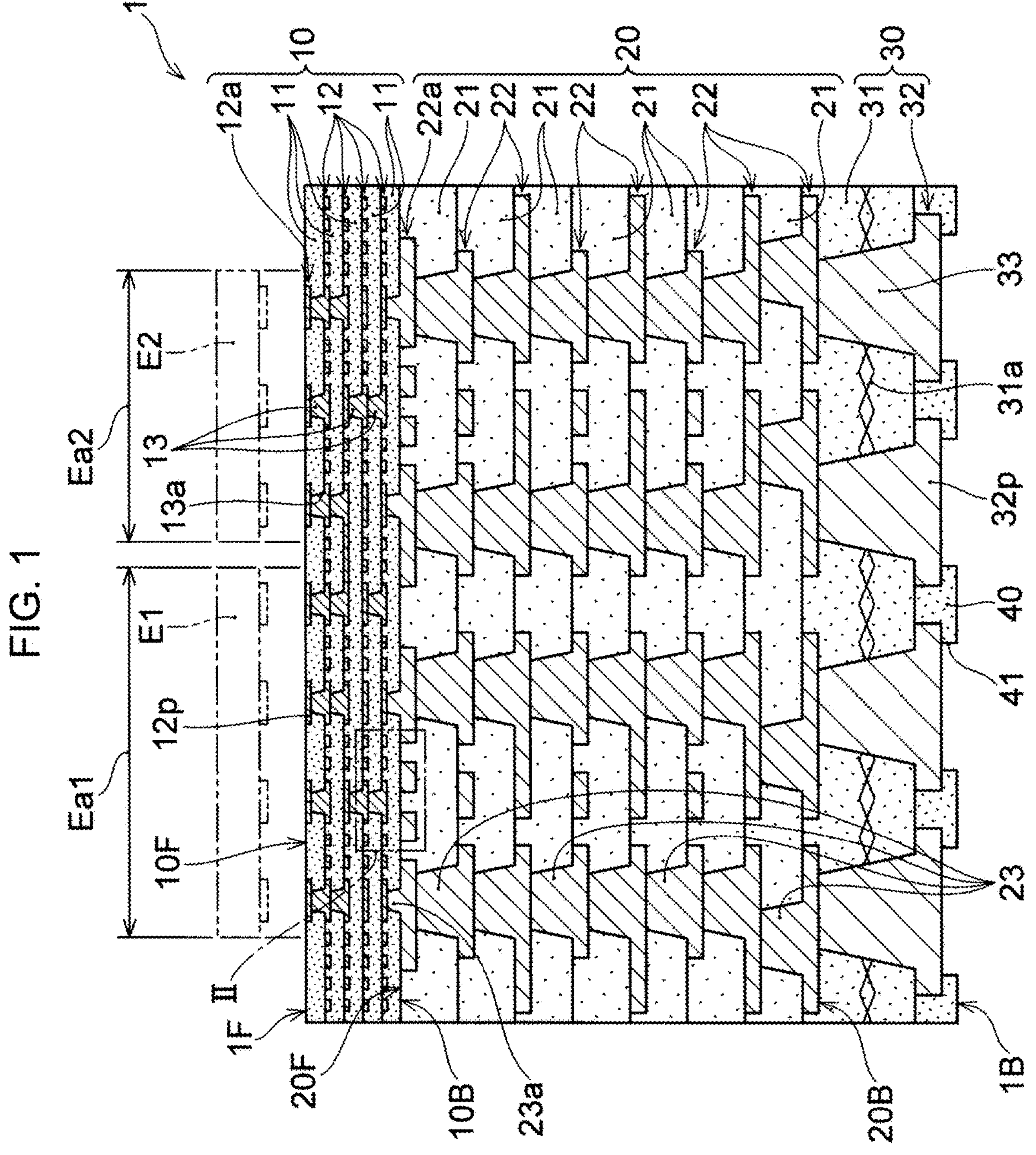
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Structure of Wiring Substrate

Figure 2:
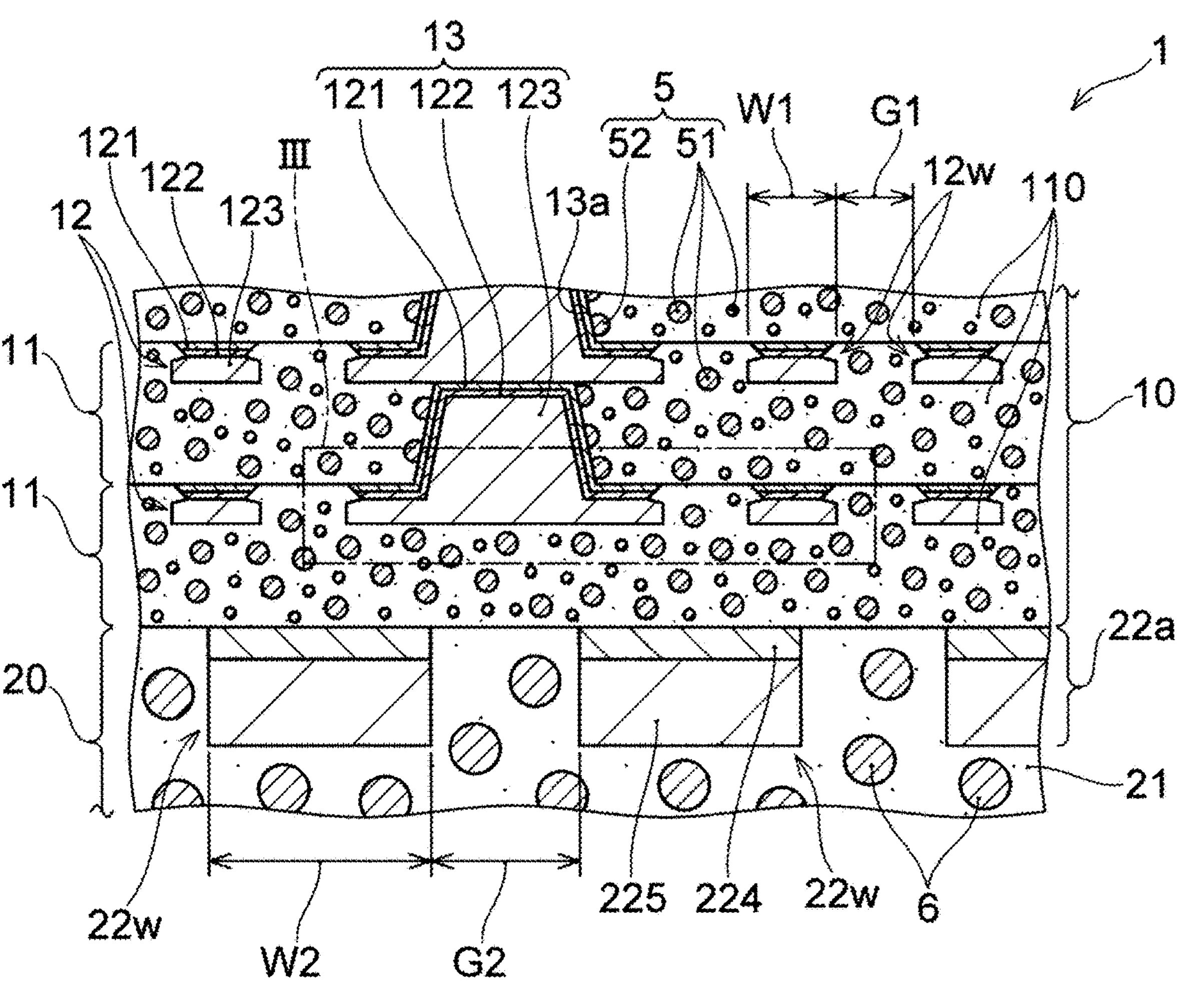
FIG. 2 is an enlarged view of a portion (II) of FIG. 1.

A wiring substrate according to an embodiment of the present invention is described with reference to the drawings. FIG. 1 illustrates a cross-sectional view of a wiring substrate 1, which is an example of the wiring substrate of the embodiment. FIG. 2 illustrates an enlarged view of a portion (II) of FIG. 1. The number and thicknesses of conductor layers and insulating layers, as well as conductor patterns included in the conductor layers, in the wiring substrate of the present embodiment are not limited to the number and thicknesses of conductor layers and insulating layers, and the conductor patterns, included in the wiring substrate 1 illustrated in FIG. 1.

As illustrated in FIGS. 1 and 2, the wiring substrate 1 has two surfaces (a first surface (1F) and a second surface (1B) on the opposite side with respect to the first surface (1F)) perpendicular to a thickness direction of the wiring substrate 1. The wiring substrate 1 includes a first build-up part 10 and a second build-up part 20. The first build-up part 10 is laminated on the first surface (1F) side of the second build-up part 20. A lamination direction of the first build-up part 10 and the second build-up part 20 is the thickness direction of the wiring substrate 1. The first build-up part 10 and the second build-up part 20 completely overlap each other. The wiring substrate 1 illustrated in FIG. 1 further includes a third build-up part 30, which is laminated on the second build-up part 20 on the second surface (1B) side of the wiring substrate 1, and a solder resist 40, which covers a surface of the third build-up part 30. The wiring substrate of the present embodiment can be a coreless wiring substrate that does not include a core layer, such as the wiring substrate 1 illustrated in FIG. 1.

In the description of the wiring substrate 1 of the present embodiment, the first surface (1F) side of the wiring substrate 1 is also referred to as "upper" or an "upper side," and the second surface (1B) side of the wiring substrate 1 is also referred to as "lower" or a "lower side." Further, for each of the structural elements, a surface facing the first surface (1F) side of the wiring substrate 1 is also referred to as an "upper surface," and a surface facing the second surface (1B) side of the wiring substrate 1 is also referred to as a "lower surface."

The first build-up part 10 has a first surface (10F), which is the same surface as the first surface (1F) of the wiring substrate 1, and a second surface (10B) which is on the opposite side with respect to the first surface (1F). The first build-up part 10 includes alternately laminated conductor layers 12 (first conductor layers) and insulating layers 11 (first insulating layers). Each conductor layer 12 is formed on a lower surface of an upper side adjacent insulating layer 11. The first build-up part 10 further includes a conductor layer (12*a*), which is a conductor layer closest to the first surface (1F) of the wiring substrate 1 in the first build-up part 10.

The conductor layer (12*a*) is embedded in an insulating layer 11 which is closest to the first surface (1F) of the wiring substrate 1 in the first build-up part 10, with an upper surface thereof exposed from the first surface (1F). The first surface (1F) of the wiring substrate 1 is formed by the exposed upper surface of the conductor layer (12*a*) and an upper surface of the insulating layer 11 in which the conductor layer (12*a*) is embedded.

The first surface (1F) of the wiring substrate 1 includes one or more component regions (a component region (Ea1) and a component region (Ea2) in the example of FIG. 1) on which mounting components (a component (E1) and a component (E2) in the example of FIG. 1) are mounted when the wiring substrate 1 is used. The first surface (1F) of the wiring substrate 1 can be a component mounting surface that is at least partially covered by mounting components such as the component (E1) and the component (E2) when the wiring substrate 1 is in use.

The conductor layers 12 and conductor layer (12*a*) each include any conductor patterns. The conductor layers 12 include wirings (12*w*) (see FIG. 2) as conductor patterns. Further, the conductor layer (12*a*), which forms a component mounting surface in the first build-up part 10, includes component mounting pads (12*p*) formed of conductor pads. Each of the component mounting pads (12*p*) is embedded in the insulating layer 11 that forms the first surface (1F) of the wiring substrate 1, with one surface thereof exposed from the first surface (1F). The exposed surfaces of the component mounting pads (12*p*) can be connected to electrodes of a mounting component by, for example, a conductive bonding material such as solder (not illustrated). A surface treatment layer (not illustrated) formed of a plating layer or the like containing, for example, nickel, palladium, gold, or the like may be formed on the exposed surface of the component mounting pads (12*p*).

Examples of the components (E1, E2) that can be mounted on the wiring substrate 1 include electronic components such as active components such as semiconductor integrated circuit devices and transistors. As some examples, the components (E1, E2) can each be an integrated circuit device such as a logic chip, a processing device such as an MPU (Micro Processor Unit), or a memory device such as an HBM (High Bandwidth Memory).

The first build-up part 10 further includes via conductors 13 (first via conductors) penetrating the insulating layers 11. The via conductors 13 are formed in openings (13*a*) penetrating the insulating layers 11. Each via conductor 13 connects a conductor layer 12 below an insulating layer 11 that includes the each via conductor 13 to a conductor layer 12 or the conductor layer (12*a*) above the insulating layer 11. Each via conductor 13 is integrally formed with a conductor layer 12 that is in contact with an end of the each via conductor 13 on the second surface (1B) side of the wiring substrate 1.

The second build-up part 20 has a first surface (20F), which is a surface on the first surface (1F) side of the wiring substrate 1, and a second surface (20B), which is a surface on the opposite side with respect to the first surface (20F). The first surface (20F) of the second build-up part 20 faces the second surface (10B) of the first build-up part 10. The second build-up part 20 includes alternately laminated conductor layers 22 and insulating layers 21 (second insulating layers), as well as via conductors 23 (second via conductors) penetrating the insulating layers 21. The second build-up part 20 further includes a conductor layer (22*a*) (second conductor layer), which is a conductor layer closest to the first surface (20F) in the second build-up part 20, and via conductors (23*a*). The via conductors (23*a*) are integrally formed with the conductor layer (22*a*), and penetrate the insulating layer 11 closest to the second build-up part 20 in the first build-up part 10. The first surface (20F) of the second build-up part 20 is formed by an upper surface of the insulating layer 21 positioned closest to the first build-up part 10 among the multiple insulating layers 21, and an upper surface of the conductor layer (22*a*).

On the other hand, the second surface (20B) of the second build-up part 20 is formed by lower surfaces of the insulating layer 21 and conductor layer 22 that are positioned closest to the second surface (1B) of the wiring substrate 1 in the second build-up part 20. In the wiring substrate 1 illustrated in FIG. 1, the second surface (20B) of the second build-up part 20 faces a surface (upper surface) of the third build-up part 30 on the first surface (1F) side of the wiring substrate 1.

The conductor layers 22 and conductor layer (22*a*) each include any conductor patterns. The conductor layer (22*a*) includes wirings (22*w*) (see FIG. 2) as conductor patterns. Each of the conductor layers 22 and conductor layer (22*a*) is formed on a lower surface of an upper side adjacent insulating layer 21 or insulating layer 11. Each via conductor 23 connects a conductor layer 22 below an insulating layer 21 that includes the each via conductor 23 to a conductor layer 22 or the conductor layer (22*a*) above the insulating layer 21. The via conductors (23*a*) connects the conductor layer (22*a*) to a conductor layer 12 in first build-up part 10.

The third build-up part 30 includes laminated insulating layer 31 (third insulating layer) and conductor layer 32 (third conductor layer), and via conductors 33 (third via conductors). The conductor layer 32 includes any conductor patterns, such as conductor pads (32*p*). The via conductors 33 connects the conductor layer 32 to a conductor layer 22 included in the second build-up part 20.

The solder resist 40 is formed on surfaces of the insulating layer 31 and conductor layer 32 on the second surface (1B) side of the wiring substrate 1. Openings 41 are formed in the solder resist 40, and the conductor pads (32*p*) are exposed in the openings 41. The solder resist 40 is formed using, for example, a photosensitive polyimide resin or epoxy resin.

In the example of FIG. 1, the second surface (1B) of the wiring substrate 1 is formed of a surface of the solder resist 40 on the second surface (1B) side of the wiring substrate 1 and an exposed surface of the conductor layer 32 exposed from the solder resist 40. However, the wiring substrate of the present embodiment does not necessarily include the third build-up part 30 and/or the solder resist 40. For a wiring substrate of an embodiment that does not include the third build-up part 30, the second surface is either the second surface (20B) of the second build-up part 20, or is formed of a solder resist formed on the second surface (20B) of the second build-up part 20 and exposed portions of the second surface (20B) from the solder resist.

The second surface (1B) of the wiring substrate 1 can be a connecting surface to be connected to an external element such as an external wiring substrate (for example, a motherboard of any electrical device) when the wiring substrate 1 itself is mounted on the external element. In the example of FIG. 1, the conductor pads (32*p*) of third build-up part 30 can be connected to any substrate, electrical component, mechanical component, or the like.

The insulating layers 11, insulating layers 21, and insulating layer 31 can be formed, for example, using a thermosetting insulating resin such as an epoxy resin, a bismaleimide triazine resin (BT resin), or a phenol resin. The insulating layers (11, 21, 31) may also be formed using a thermoplastic insulating resin such as a fluororesin, a liquid crystal polymer (LCP), a fluorinated ethylene resin (PTFE), a polyester resin (PE), or a modified polyimide resin (MPI). The insulating layers (11, 21, 31) may contain the same insulating resin or may contain mutually different insulating resins.

The insulating layers (11, 21, 31) may contain a core material (reinforcing material) formed of a glass fiber or the like. In the example of FIG. 1, the insulating layer 31 contains a core material (31*a*). The core material (31*a*) may provide the wiring substrate 1 with adequate rigidity. The core material (31*a*) can be, for example, a glass fiber or an aramid fiber. On the other hand, an insulating layer that does not include a core material such as a glass fiber may facilitate formation of fine wirings on a surface thereof or enhance adhesion with a conductor layer. In the example of FIG. 1, the insulating layers 11 and the insulating layers 21 do not contain any core material.

Although omitted in FIG. 1, the insulating layers (11, 21, 31) may further contain inorganic particles added as a filler to an insulating resin forming the insulating layers (11, 21, 31). The insulating layers containing inorganic particles are, for example, imparted with low thermal expansion coefficients or high thermal conductivities. In the wiring substrate 1 of the present embodiment, as illustrated in FIG. 2, the insulating layers 11 of the first build-up part 10 contain multiple inorganic particles 5 and an insulating resin 110 such as the above-described epoxy resin. A content of the inorganic particles 5 in the insulating layers 11 is, for example, 75 wt % or more. In the example of FIG. 2, the insulating layers 21 included in the second build-up part 20 contain inorganic particles 6. The inorganic particles 5 and inorganic particles 6 are fine particles formed of, for example, silica ($SiO_2$), alumina, mullite, or the like.

In the example of FIG. 2, a maximum particle size of the inorganic particles 5 is smaller than a maximum particle size of the inorganic particles 6. A "particle size" of each of the inorganic particles (5, 6) is a maximum distance between two points on a surface of each inorganic particle. For example, the maximum particle size of the inorganic particles 5 is 1 μm or less, and an average particle size of the inorganic particles 5 is 0.5 μm or less. On the other hand, the maximum particle size of the inorganic particles 6 is, for example, 4 μm or less. When the particle sizes of the inorganic particles (5, 6) are small, even between wirings formed at fine pitches in the conductor layers in contact with the insulating layers, a short circuit failure due to a leakage path along inorganic particles or the like is unlikely to occur. Further, formation of small-sized via conductors may be facilitated. The first build-up part 10 containing the inorganic particles 5 with smaller particle sizes can have good reliability regarding insulation between wirings and can include wirings formed at fine pitches.

The conductor layers (12, 12*a*, 22, 22*a*), the conductor layer 32, the via conductors (13, 23, 23*a*), and the via conductors 33 can be formed using a metal such as copper or a copper alloy having appropriate conductivity. In FIG. 1, the conductor layers and the via conductors are each depicted as having a single-layer structure. However, the conductor layers and the via conductors can each have a multilayer structure, as illustrated for the conductor layers 12 and conductor layer (22*a*) in FIG. 2. In the wiring substrate 1 of the present embodiment, at least the conductor layers 12 of the first build-up part 10 each have a multilayer structure of three or more layers.

That is, the conductor layers 12 and via conductors 13 each include, as illustrated in FIG. 2, a first metal layer 121, a second metal layer 122, and a third metal layer 123. In each of the conductor layers 12, the first metal layer 121 is formed closest to the first surface (1F) of the wiring substrate 1 (see FIG. 1). The second metal layer 122 is laminated on a surface (lower surface) of the first metal layer 121 and is in contact with the lower surface of the first metal layer 121. The third metal layer 123 is laminated on a surface (lower surface) of the second metal layer 122 and is in contact with the lower surface of the second metal layer 122. Therefore, the conductor patterns such as the wirings (12*w*) included in the conductor layers 12 of the first build-up part 10 each include: the first metal layer 121; the second metal layer 122 laminated on the second surface (1B) side of the first metal layer 121 (see FIG. 1); and the third metal layer 123 laminated on the second surface (1B) side of the second metal layer 122.

On the other hand, in the wiring substrate 1 illustrated in FIG. 1, the conductor layers (22, 22*a*) of the second build-up part 20 may each be formed of a fourth metal layer 224 and a fifth metal layer 225, as illustrated for the conductor layer (22*a*) in FIG. 2. The fourth metal layer 224 is formed on the first build-up part 10 side of the conductor layer (22*a*). The fifth metal layer 225 is formed on the fourth metal layer 224 on the second surface (1B) side of the wiring substrate 1. Although not illustrated, the via conductors (23, 23*a*) of the second build-up part 20, as well as the conductor layer 32 and via conductors 33 of the third build-up part 30, also can each have a two-layer structure similar to the conductor layer (22*a*) illustrated in FIG. 2. The conductor layer 32 may further have a structure including a layer formed of a metal foil in contact with a lower surface of the insulating layer 31.

The fourth metal layer 224 covers a portion of a lower surface of the insulating layer 11 or insulating layer 21 on the first surface (1F) side of the wiring substrate 1 in each conductor layer such as the conductor layer (22*a*). The fifth metal layer 225 entirely covers a surface of the fourth metal layer 224 on the opposite side with respect to the first build-up part 10 side. The fifth metal layer 225 can be, for example, an electrolytic plating film layer formed by electrolytic plating. The fourth metal layer 224 may be a seed layer for the electrolytic plating film layer forming the fifth metal layer 225. The fourth metal layer 224 is formed using any method. For example, the fourth metal layer 224 can be an electroless plating film formed by a wet process.

As illustrated in FIG. 1, the via conductors (13, 23, 23*a*, 33) all have a tapered shape that is reduced in diameter from the second surface (1B) toward the first surface (1F) of the wiring substrate 1. Since the via conductors (13, 23, 23*a*, 33) have such a tapered shape, it may be possible that a conductor layer closer to the first surface (1F), which can serve as a component mounting surface, can include wirings formed at a finer pitch. A shape of a horizontal cross section (a cross section perpendicular to the thickness direction of the wiring substrate 1) of each of the via conductors (13, 23, 23*a*, 33) is not necessarily limited to a circular shape. The term “reduced in diameter” means that a longest distance between two points on an outer circumference of a horizontal cross section of each via conductor (hereinafter this distance is also referred to as the “width” of each via conductor) is reduced.

Each via conductor 13 included in the first build-up part 10 has, for example, an aspect ratio ((the distance between the upper surface of a lower conductor layer 12 to which the via conductor 13 is connected and the lower surface of an upper conductor layer 12 or the conductor layer (12*a*))/(the width of the via conductor 13 at the upper surface of the lower conductor layer 12)) of 0.5 or more and 1.0 or less. It may be possible that the first build-up part 10 can include wirings formed at fine pitches and via conductors 13 that are unlikely to break and have low conductor resistance. The width of each via conductor 13 at the upper surface of the lower conductor layer 12 is, for example, about 10 μm. On the other hand, in the second build-up part 20, the width of each via conductor 23 at the upper surface of the lower conductor layer 22 is about 50 μm.

As illustrated in FIG. 2, each wiring (12*w*) included in the conductor layers 12 of the first build-up part 10 has a wiring width (W1) as a width thereof. The wirings (12*w*) have an inter-wiring distance (G1) as a distance between adjacent wirings (12*w*). The wiring width (W1) is a minimum wiring width among widths of the wirings included in the conductor layers 12. Further, the inter-wiring distance (G1) is a minimum inter-wiring distance among inter-wiring distances of the wirings included in the conductor layers 12. On the other hand, each wiring (22*w*) included in the conductor layers 22 of the second build-up part 20 has a wiring width (W2) as a width thereof. The wirings (22*w*) have an inter-wiring distance (G2) as a distance between adjacent wirings (22*w*). The wiring width (W2) is a minimum wiring width among widths of the wirings included in the conductor layers 22. Further, the inter-wiring distance (G2) is a minimum inter-wiring distance among inter-wiring distances of the wirings included in the conductor layers 22.

The “wiring width” of each wiring such as a wiring (12*w*) included in the conductor layers of the first build-up part 10 is a width of the third metal layer 123 of each wiring (a maximum width when the width of the third metal layer 123 varies in a thickness direction of each wiring). Further, the “inter-wiring distance” of wirings such as the wirings (12*w*) included in the conductor layers of the first build-up part 10 is a distance between the third metal layers 123 of the wirings (a minimum distance when the distance between the third metal layers 123 varies in the thickness direction of the wirings). Similarly, the “wiring width” and “inter-wiring distance” of wirings such as the wirings (22*w*) included in the conductor layers of the second build-up part 20 are respectively a width of the second metal layer 225 of each wiring and a distance between the fifth metal layers 225 of the wirings.

As illustrated in FIG. 2, the wiring width (W1) is smaller than the wiring width (W2). Also, the inter-wiring distance (G1) is smaller than the inter-wiring distance (G2). That is, regarding the wirings included in the conductor layers 12, the conductor layers 12 have a minimum wiring width smaller than the minimum wiring width of the wirings included in the conductor layer (22*a*), and a minimum inter-wiring distance smaller than the minimum inter-wiring distance of the wirings included in the conductor layer (22*a*). In this way, in the wiring substrate of the embodiment, the conductor layers 12 that form the first build-up part 10 together with the insulating layers 11 can include wirings formed according to wiring rules different from the wirings included in the second build-up part 20.

In the wiring substrate 1 of the embodiment, the first build-up part 10 can be a laminate of such conductor layers 12 and insulating layers 11. The wiring substrate 1 of the embodiment that includes the first build-up part 10 having conductor layers with smaller minimum wiring width and minimum inter-wiring distance than the conductor layers of the second build-up part 20, together with the second build-up part 20, can include fine wirings only in the necessary conductor layers. Then, the wiring substrate 1 of the embodiment can include conductor layers containing wirings with wider widths or inter-wiring distances, that is, wirings that are easier to form, as other conductor layers.

In the wiring substrate 1 of the embodiment, the minimum wiring width of wirings such as the wirings (12*w*) included in the conductor layers 12 can be, for example, 1 μm or more and 3 μm or less, and the minimum inter-wiring distance of the wirings included in the conductor layers 12 can be, for example, 1 μm or more and 3 μm or less. When the first build-up part 10 is formed by the conductor layers 12 including wirings formed at such a fine pitch, it may be possible that wirings having more suitable characteristics corresponding to electrical signals transmitted by the wirings in the first build-up part 10 can be provided. Further, it may be possible that a density of the wirings in the first build-up part 10 is high and thus a compact wiring substrate 1 can be obtained.

On the other hand, the minimum wiring width of the wirings included in conductor layers such as the conductor layer (22*a*) or conductor layers 22 forming the second build-up part 20 can be, for example, about 4 μm, and the minimum inter-wiring distance can be, for example, about 6 μm. It may be possible that the formation of the conductor layers of the second build-up part 20 is relatively easy.

In addition, in the wiring substrate 1 of the embodiment, the aspect ratio of the wirings such as the wirings (12*w*) included in the conductor layers 12 of the first build-up part 10 can be, for example, 2.0 or more and 4.0 or less. Wirings having such an aspect ratio can have a low conductor resistance despite the small wiring width, and thus can serve as a signal transmission path with low insertion loss. For example, it may be possible that signals can be propagated between components mounted on the wiring substrate 1 with little transmission loss. Further, it may be possible that a desired characteristic impedance can be easily obtained, and thus, the insertion loss can be further reduced.

In the example of FIGS. 1 and 2, thicknesses of the conductor layers 12 are different from thicknesses of the conductor layers 22 and the conductor layer (22*a*). Further, thicknesses of the insulating layers 11 are different from thicknesses of the insulating layers 21. In this way, in the present embodiment, the first build-up part 10 may be a laminate of conductor layers and insulating layers, with the conductor layers having thicknesses different from the thicknesses of the conductor layers in the second build-up part 20. Further, in the present embodiment, the first build-up part 10 may be a laminate of insulating layers and conductor layers, with the insulating layers having thicknesses different from the thicknesses of the insulating layers in the second build-up part 20. Further, as described above, the particle sizes of the inorganic particles 5 contained in the insulating layers 11 are different from the particle sizes of the inorganic particles 6 contained in the insulating layers 21. Therefore, in the present embodiment, the first build-up part 10 may be a laminate of insulating layers and conductor layers, with the insulating layers being formed of a material different from a material of the insulating layers in the second build-up part 20.

For example, the thickness of a conductor layer such as a conductor layer 12 included in the first build-up part 10 can be 4 μm or more and 7 μm or less. It may be advantageous for forming the wirings (12*w*) and the like at fine pitches as etching residues and the like are unlikely to occur during manufacturing. The thicknesses of the insulating layers 11 included in the first build-up part 10 can be, for example, about 7.5 to 10 μm. On the other hand, the thicknesses of the conductor layers such as the conductor layers (22, 22*a*) included in the second build-up part 20 can be 10 μm or more and less than 20 μm. Further, the thicknesses of the insulating layers such as the insulating layers 21 included in the second build-up part 20 can be 20 μm or more and less than 100 μm.

The surfaces of the conductor layers 12 in the first build-up part 10 on the second build-up part 20 side (the second surface (1B) side of the wiring substrate 1) can be polished surfaces finished by polishing. In the example of FIG. 1, the surfaces of all four conductor layers 12 on the second surface (1B) side are polished surfaces. A polished surface can have a lower surface roughness than that of a plating film formed as it is by metal deposition. Therefore, it is thought that, in wirings included in each conductor layer 12 having a polished surface, deterioration in signal transmission characteristics or an increase in voltage drop is unlikely to occur. For example, a polished surface that each conductor layer 12 has as a surface on the second surface (1B) side can have an arithmetic mean roughness of 0.3 μm or less. When such a surface roughness is obtained, it may be possible that the effect described above regarding the transmission characteristics can be obtained.

Although not illustrated, in the wiring substrate 1 of FIG. 1, wiring widths of wirings of the conductor layer 32 included in the third build-up part 30 are larger than the wiring widths of the wirings such as the wirings (22*w*) included in the second build-up part 20. Further, inter-wiring distances of the wirings of the conductor layer 32 are larger than the inter-wiring distances of the wirings included in the second build-up part 20. Further, the insulating layer 31 and the conductor layer 32 in the third build-up part 30 are both formed thicker than the insulating layers 21 and the conductor layers (22, 22*a*) in the second build-up part 20. For example, the thickness of the insulating layer 31 is about 100 μm or more and 200 μm or less. Further, the thickness of the conductor layer 32 is about 20 μm. A width of each via conductor 33 formed in the insulating layer 31 (a width on an upper surface of the conductor layer 32) is about 100 μm.

As illustrated in FIG. 2, a lower surface (11*a*), which is a surface (insulating layer surface) facing the second build-up part 20 side, of each insulating layer 11 forming the first build-up part 10 is formed substantially only of the resin 110. From the lower surface (11*a*) of each insulating layer 11, the inorganic particles 5 are substantially not exposed or only slightly exposed. Further, as will be described later, the lower surface (11*a*) of each insulating layer 11 is preferably not intentionally roughened during a manufacturing process of the wiring substrate 1. Therefore, the lower surface (11*a*) of each insulating layer 11 is a smooth surface having substantially no recesses. For example, an arithmetic mean roughness (Ra) of the lower surface (11*a*) of each insulating layer 11 is 0.02 μm or more and 0.06 μm or less. It may be possible that necessary adhesion with the conductor layer 12 or conductor layer (22*a*) formed on the lower surface (11*a*) of each insulating layer 11 is ensured, and good high-frequency signal transmission characteristics and inter-wiring insulation can be obtained in the wirings included in the conductor layer 12 or conductor layer (22*a*).

As illustrated in FIG. 2, in the wiring substrate 1 of the present embodiment, the multiple inorganic particles 5 include first inorganic particles 51 and second inorganic particles 52. The first inorganic particles 51 each have a substantially spherical shape. The first inorganic particles 51 are inorganic particles among the multiple inorganic particles 5 that are entirely embedded in the resin 110 forming the insulating layers 11. On the other hand, the second inorganic particles 52 are inorganic particles exposed on inner wall surfaces of the insulating layers 11 exposed to the openings (13*a*). The second inorganic particles 52 form the inner wall surfaces of the insulating layers 11 exposed to the openings (13*a*). The second inorganic particles 52 each have a spherical segment shape.

Figure 3:
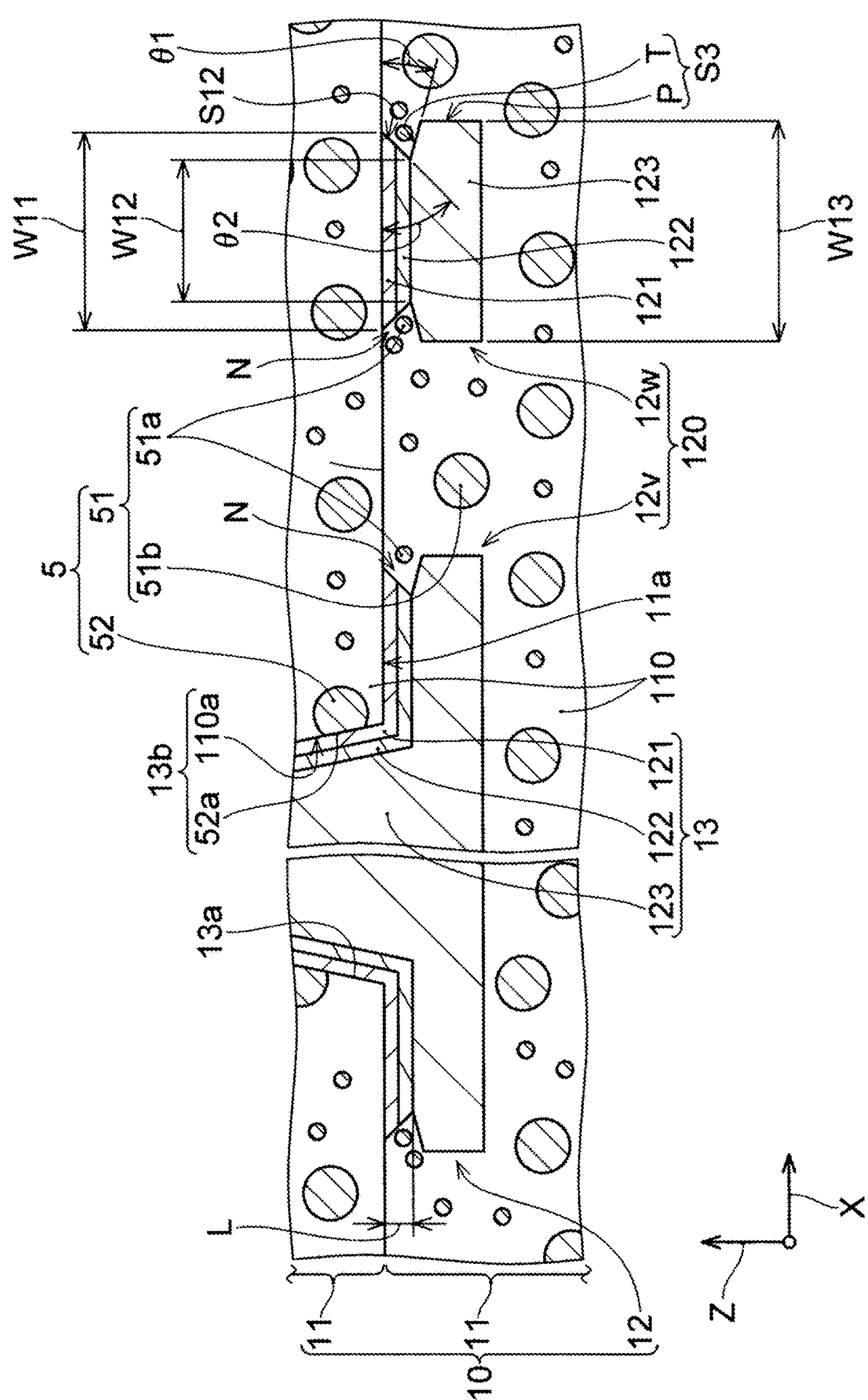
FIG. 3 is an enlarged view of a portion (III) of FIG. 2.

FIG. 3 illustrates an enlarged view of a portion (III) of FIG. 2. With reference to FIG. 3 in addition to FIG. 2, the conductor layers 12 of the first build-up part 10 and the conductor patterns included in the conductor layers 12 will be further described.

The first metal layer 121 of each conductor layer 12 covers a part of the lower surface of the insulating layer 11 on the first surface (1F) side (see FIG. 1) of the wiring substrate 1, and entirely covers the inner wall surfaces exposed to the openings (13*a*) penetrating the insulating layer 11. The second metal layer 122 entirely covers the surface of the first metal layer 121 on the second build-up part 20 side (see FIG. 2, the lower side in FIG. 3). The third metal layer 123 entirely covers the surface of the second metal layer 122 on the second build-up part 20 side. The openings (13*a*) are filled with the first metal layer 121, the second metal layer 122, and the third metal layer 123. The via conductors 13 are formed by the first-third metal layers (121, 122, 123) filling the openings (13*a*).

The third metal layer 123 is, for example, formed of a plating film, and preferably formed of an electrolytic plating film. When the third metal layer 123 is formed of an electrolytic plating film, the first metal layer 121 and the second metal layer 122 can be a two-layered seed layer that functions as a power feeding layer during the formation of the third metal layer 123 by electrolytic plating. That is, the first metal layer 121 and the second metal layer 122 can be a seed layer of the electrolytic plating film forming the third metal layer 123.

The first metal layer 121 and the second metal layer 122 are each formed using any method such as electroless plating or sputtering. For example, the first metal layer 121 and the second metal layer 122 may each be a sputtering film formed with a dry process. A sputtering film can have good adhesion with a resin such as an epoxy resin. Therefore, it is thought that each conductor layer 12 having a seed layer which is a sputtering film, that is, the first metal layer 121 and the second metal layer 122 (especially the first metal layer 121) which are sputtering films, is firmly adhered to the insulating layer 11 on the first surface (1F) side of the wiring substrate 1. As described above, the conductor layers 12 can include fine conductor patterns such as the wirings (12*w*). It is thought that, when the conductor layers 12 including fine conductor patterns are firmly adhered to the insulating layers 11, peeling or the like between the conductor layers and the insulating layers in the wiring substrate 1 can be suppressed. That is, it is thought that loss of a wiring such as a wiring (12*w*) is suppressed.

As illustrated in FIG. 3, in a cross section of a conductor pattern 120 of a conductor layer 12, such as a wiring (12*w*) or a via pad (12*v*), a width (W11) of the first metal layer 121 is larger than a width (W12) of the second metal layer 122. In addition, a width (W13) of the third metal layer 123 is larger than the width (W11) of the first metal layer. FIG. 3 illustrates a cross section of a conductor pattern of a conductor layer 12 along the lamination direction of the first build-up part 10 and the second build-up part 20 (see FIG. 2) (hereinafter, this cross section is also simply referred to as the "cross section (C)"). The lamination direction of the first build-up part 10 and the second build-up part 20 is hereinafter also simply referred to as the "Z direction." The width (W11) of the first metal layer 121 is a length of the first metal layer 121 in an X direction orthogonal to the Z direction in the cross section (C). When the length of the first metal layer 121 in the X direction is not constant in the Z direction, the width (W11) of the first metal layer 121 is a length of the first metal layer 121 in the X direction that is the largest in the Z direction. Similarly, the width (W12) of the second metal layer 122 is a length of the second metal layer 122 in the X direction in the cross section (C), and when the length of the second metal layer 122 in the X direction is not constant in the Z direction, the width (W12) is a length of the second metal layer 122 in the X direction that is the largest in the Z direction. Further, the width (W13) of the third metal layer 123 is a length of the third metal layer 123 in the X direction in the cross section (C), and when the length of the third metal layer 123 in the X direction is not constant in the Z direction, the width (W13) is a length of the third metal layer 123 in the X direction that is the largest in the Z direction.

Since the width (W11) of the first metal layer 121 is larger than the width (W12) of the second metal layer 122, and the width (W13) of the third metal layer 123 is larger than the width (W11), the width (W13) is larger than the width (W12). Therefore, the width of the third metal layer 123, which is an electrolytic plating film in one example, is larger than the width of the seed layer (the first metal layer 121 and the second metal layer 122) of the electrolytic plating film that forms the third metal layer 123 in the one example.

The conductor pattern 120 of the conductor layer 12, which includes such first-third metal layers (121-123), has a constriction (N) in a region of the second metal layer 122. Therefore, the conductor pattern 120 has a larger contact area with the surrounding insulating layer 11 on a side surface thereof. Therefore, it is thought that the conductor pattern 120 more firmly adheres to the insulating layer 11, which is in contact with the conductor pattern 120 sideways (in the X direction), compared to a case where the conductor pattern 120 does not have the constriction (N). A length (L) of the constriction (N) in the Z direction can be about 1 μm.

Further, the first metal layer 121 having the width (W11) larger than the width (W12) of the second metal layer 122 has a larger interface with the insulating layer 11 on the first surface (1F) side (see FIG. 1) of the wiring substrate 1 than an interface with the second metal layer 122. Since a contact area with the insulating layer 11 is expanded compared to a contact area with the second metal layer 122, peeling strength between the conductor pattern 120 and the insulating layer 11, which is formed of an epoxy resin or the like, which is difficult to have high adhesion with metal, is improved.

Further, a portion of the insulating layer 11 on the side of the conductor pattern 120 near the constriction (N) enters into a recess on the side surface of the conductor pattern 120 caused by the constriction (N). Therefore, movement of the conductor pattern 120 in the Z direction is suppressed. Therefore, the conductor pattern 120 is unlikely to separate from the insulating layer 11, which is in contact with the conductor pattern 120 on the first surface (1F) side of the wiring substrate 1. Therefore, it is thought that peeling between the conductor layer 12 and the insulating layer 11 is further suppressed.

In this way, according to the wiring substrate of the present embodiment, adhesion between the conductor layer 12 and the insulating layer 11 is improved, and interlayer peeling is suppressed, and thus, it is thought that loss of a wiring such as a wiring (12*w*) is suppressed.

In the example of FIG. 3, the width of the conductor pattern 120 in the cross section (C) is smallest at a boundary portion between the second metal layer 122 and the third metal layer 123. Further, in the cross section (C) illustrated in FIG. 3, a side surface (S3) of the third metal layer 123 has a tapered portion (T) inclined toward an inner side of the conductor pattern 120 more on the second metal layer 122 side, and a parallel portion (P) extending substantially along the Z direction. The tapered portion (T) is formed near an interface with the second metal layer 122 and is in contact with the second metal layer 122.

In the example of FIG. 3, in the cross section (C), inclination (first angle ($\theta$1)) of the tapered portion (T) from the lower surface (insulating layer surface) (11*a*) of the insulating layer 11 facing the second build-up part 20 side (see FIG. 2) is smaller than inclination (second angle ($\theta$2)) of a side surface (S12) of the first metal layer 121 and second metal layer 122 from the lower surface (11*a*). That is, inclination (90°−$\theta$1) of the tapered portion (T) with respect to the lamination direction (Z direction) of the first build-up part 10 and the second build-up part 20 is larger than inclination (90°−$\theta$2) of the side surface (S12) of the first metal layer 121 and second metal layer 122 with respect to the Z direction. As a result, a thinnest portion of the conductor pattern 120 is more separated from the lower surface (11*a*) of the insulating layer 11. Therefore, a strain propagated from the lower surface (11*a*) to the thinnest portion of the conductor pattern 120 due to a change in temperature is relaxed. Therefore, it may be possible that occurrence of a crack or the like in the conductor pattern 120 is suppressed.

The "side surface (S3) of the third metal layer 123" is a surface other than an upper surface and a lower surface of the third metal layer 123 and is a surface connecting the upper surface and the lower surface. Similarly, the "side surface (S12) of the first metal layer 121 and second metal layer 122" is a surface other than an upper surface and a lower surface of the laminate of the first metal layer 121 and second metal layer 122, and is a surface connecting the upper surface and the lower surface.

A total thickness of the first metal layer 121 and the second metal layer 122 is, for example, 0.02 μm or more and 1 μm or less, preferably 0.03 μm or more and 0.5 μm or less, and more preferably 0.05 μm or more and 0.3 μm or less. As described above, the arithmetic mean roughness (Ra) of the lower surface (11*a*) of the insulating layer 11 can be 0.02 μm or more and 0.06 μm or less. Therefore, when the total thickness of the first metal layer 121 and the second metal layer 122 is less than 0.02 μm, it may become difficult to uniformly form the seed layer formed of these two metal layers over the entire lower surface (11*a*) of the insulating layer 11. Further, when the total thickness of the first metal layer 121 and the second metal layer 122 exceeds 1 μm, it may become difficult to control the wiring widths of the wirings (12*w*) and the like in an etching removal process of the seed layer formed of these two metal layers.

The thickness of the first metal layer 121 is 0.01 μm or more and 0.5 μm or less, preferably 0.02 μm or more and 0.3 μm or less, and more preferably 0.03 μm or more and 0.1 μm or less. When the thickness of the first metal layer is less than 0.01 μm, the adhesion between the conductor layer 12 and the insulating layer 11 decreases. When the thickness of the first metal layer 121 exceeds 0.5 μm, as will be described later, since the first metal layer 121 can be formed of a copper alloy, for example, instead of pure copper, it may be possible that a low resistance value required for the conductor pattern 120 such as a wiring (12*w*) cannot be obtained.

The thickness of the second metal layer 122 is 0.01 μm or more and 0.9 μm or less, preferably 0.02 μm or more and 0.3 μm or less, and more preferably 0.03 μm or more and 0.2 μm or less. When the thickness of the second metal layer 122 is less than 0.01 μm, it may be possible that the low resistance value required for the conductor pattern 120 such as a wiring (12*w*) cannot be obtained. When the thickness of the second metal layer 122 exceeds 0.9 μm, since the first metal layer 121 is thin, it may be possible that the adhesion between the conductor layer 12 and the insulating layer 11 decreases.

The first metal layer 121 is formed of, for example, an alloy containing copper and an element other than copper, that is, a copper alloy. On the other hand, the second metal layer 122 can be formed of a copper alloy different from the first metal layer 121 in one example, but is preferably formed of substantially pure copper. The third metal layer 123 is also preferably formed of substantially pure copper. A copper alloy can have a higher adhesion strength to a resin such as an epoxy resin used for the insulating layer 11 compared to pure copper. Therefore, peeling of the conductor layer 12 from the insulating layer 11 is further suppressed.

A weight of copper in the copper alloy forming the first metal layer 121 is, for example, 90% or more of a total weight of the copper alloy forming the first metal layer 121. The conductor pattern 120 such as a wiring (12*w*) can have a low resistance value. A content (atomic %) of copper in the second metal layer 122 is, for example, 99.5% or more, and preferably 99.95% or more. On the other hand, the conductor layers (22, 22*a*, 32) and via conductors (23, 23*a*, 33) (see FIG. 1) included in the second build-up part 20 or the third build-up part 30 may also be formed of a copper-free metal, for example, a metal with suitable conductivity such as nickel.

As illustrated in FIG. 3, in the insulating layer 11, some (first inorganic particles (51*a*)) of the multiple inorganic particles 5 enter at least partially into an inner side of the conductor pattern 120 beyond an outer edge of the third metal layer 123 around the first metal layer 121 and the second metal layer 122. The first inorganic particles (51*a*) enter into the recess formed on the side surface of the conductor pattern 120 due to the constriction (N) of the conductor pattern 120. The first inorganic particles (51*a*) are smaller than first inorganic particles (51*b*) that do not enter into the inner side of the conductor pattern 120. Particle sizes of the first inorganic particles (51*a*) can be, for example, 1.0 μm or less.

The recess on the side surface of the conductor pattern 120 due to the constriction (N) is filled with the first inorganic particles (51*a*) having small particle sizes and the resin 110. A ratio of the first inorganic particles 51 in the recess due to the constriction (N) may be larger than a ratio of the first inorganic particles 51 in the entire insulating layer 11. Therefore, in the recess due to the constriction (N), an expansion coefficient of the insulating layer 11 may approach an expansion coefficient of the conductor pattern 120. As a result, a stress that tends to be concentrated at the constriction (N), which includes a smallest width portion of the conductor pattern 120, may be reduced.

As illustrated in FIG. 3, the second inorganic particles 52 and the first inorganic particles 51 are different in shape. The second inorganic particles 52 have flat parts (52*a*). The flat parts (52*a*) form inner wall surfaces (13*b*) of the insulating layer 11 exposed to the openings (13*a*). The inner wall surfaces (13*b*) are formed by the flat parts (52*a*) of the second inorganic particles 52 and surfaces (110*a*) of the resin 110 exposed to the openings (13*a*). The flat parts (52*a*) and the surfaces (110*a*) of the resin 110 are substantially flush with each other. No unevenness is formed on the surfaces (110*a*) of the resin 110. No unevenness is formed in the flat parts (52*a*) either. For example, an arithmetic mean roughness (Ra) of the inner wall surfaces (13*b*) can be 1.0 μm or less. The inner wall surfaces (13*b*) are substantially smooth. A thin first metal layer 121 can be seamlessly formed on the inner wall surfaces (13*b*).

Next, with reference to FIGS. 4A-4M, an example of a method for manufacturing a wiring substrate according to an embodiment of the present invention is described using a case where the wiring substrate 1 illustrated in FIG. 1 is manufactured as an example. Unless there is a description different from the description provided above regarding the materials of the structural elements of the wiring substrate 1, the structural elements can be formed using any of the materials described above with respect to the structural elements.

Figure 4A:
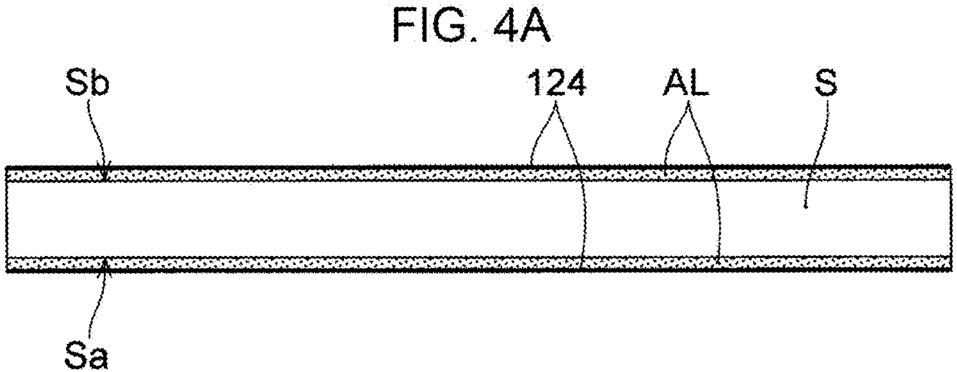
FIG. 4A is a cross-sectional view illustrating an example of a wiring substrate according to an embodiment of the present invention in a manufacturing process.

As illustrated in FIG. 4A, as an example, a support substrate(S), which is a glass substrate, is prepared. An adhesive layer (AL) containing an adhesive such as a photoplastic azobenzene polymer adhesive is formed by coating or laminating or the like on surfaces of the support substrate(S). Then, a metal film 124 formed of copper, nickel, or the like is formed on the adhesive layer (AL) by electroless plating, sputtering, or the like, or by pasting a metal foil using the adhesive layer (AL). The support substrate(S) has a first surface (Sa) and a second surface (Sb). In FIGS. 4B-4M to be referenced below, illustration of the second surface (Sb) side is omitted, and only the first surface (Sa) side is illustrated. However, a wiring substrate 1 may also be formed on the second surface (Sb) side by performing the same processing as on the first surface (Sa) side.

Figure 4B:
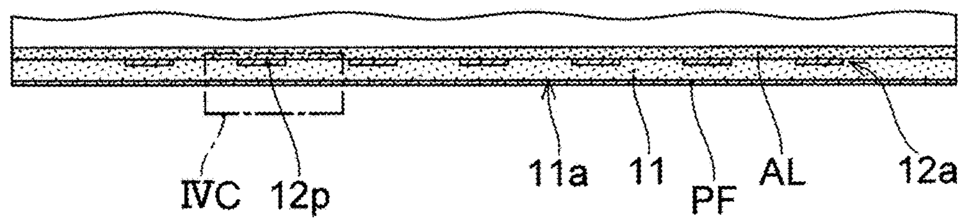
FIG. 4B is a cross-sectional view illustrating an example of a wiring substrate according to an embodiment of the present invention in a manufacturing process.

As illustrated in FIG. 4B, a conductor layer (12*a*) including conductor pads (component mounting pads (12*p*)) is formed on the adhesive layer (AL). In the formation of the conductor layer (12*a*), as illustrated in FIG. 4A, a plating resist (not illustrated) having openings corresponding to formation regions of conductor patterns to be included in the conductor layer (12*a*) is formed on the metal film 124 by laminating a dry film and performing exposure and development. Then, the conductor layer (12*a*) is formed by electrolytic plating using the metal film 124 as a power feeding layer. After that, the plating resist is removed, and further, a portion of the metal film 124 exposed due to the removal of the plating resist is removed by etching or the like. The conductor layer (12*a*) in the state illustrated in FIG. 4B is obtained.

Further, an insulating layer 11 covering the conductor layer (12*a*) is formed. The insulating layer 11 is formed, for example, by laminating and thermocompression bonding a film-like epoxy resin on the conductor layer (12*a*). As described above, the insulating layer 11 (as well as the insulating layers 21 and insulating layer 31 to be formed in subsequent processes (see FIGS. 4L and 4M)) can be formed using not only an epoxy resin but also a thermosetting resin such as a BT resin or a phenolic resin, or a thermoplastic resin such as a fluorine resin or LCP. For example, a film-like resin containing inorganic particles 5 (see FIG. 4C) formed of silica ($SiO_2$), alumina or mullite or the like and an insulating resin 110 (see FIG. 4C) formed of an epoxy resin, a phenol resin, or the like described above, is used. In the state illustrated in FIG. 4B, all the inorganic particles 5 contained in the insulating layer 11 can be the first inorganic particles 51 (see FIG. 4C).

On a surface (lower surface) (11*a*) of the insulating layer 11, a protective film (PF) formed of a polyethylene terephthalate (PET) film or the like is provided. For example, in the formation of the insulating layer 11, a film-like resin having the protective film (PF) is laminated. The protective film (PF) may be adhered to the insulating layer 11 or a film-like resin forming the insulating layer 11 via a release agent (not illustrated) or the like for easy removal of the protective film (PF).

Figure 4C:
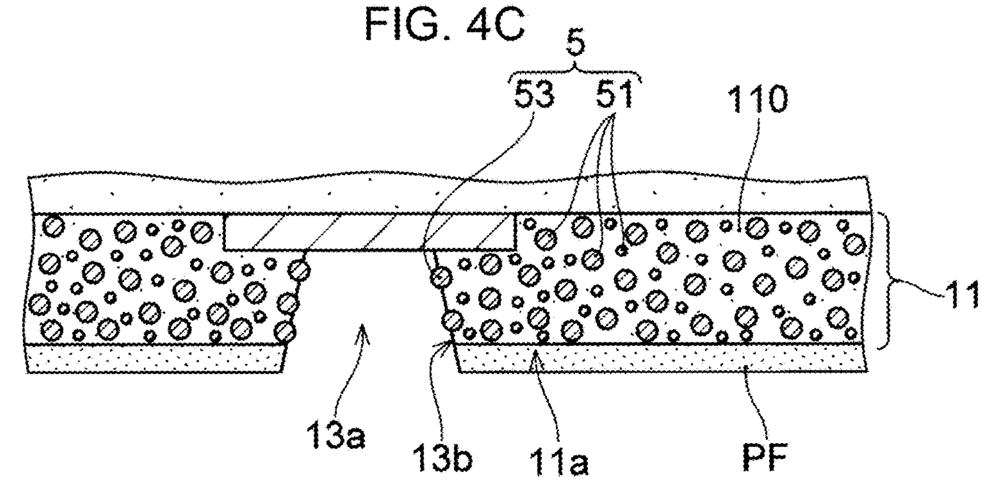
FIG. 4C is an enlarged partial cross-sectional view illustrating an example of a wiring substrate according to an embodiment of the present invention in a manufacturing process.

As illustrated in FIG. 4C, openings (13*a*) are formed at formation positions of the via conductors 13 (see FIG. 1) in the insulating layer 11 by irradiation with $CO_2$ laser or the like. FIG. 4C and FIGS. 4D-4I to be referenced below each illustrate an enlarged view of a state of a portion corresponding to a portion (IVC) of FIG. 4B after going through a process described with each drawing. The formation of the openings (13*a*) by irradiating with $CO_2$ laser or the like is performed while protecting the surface (11*a*) of the insulating layer 11 with the protective film (PF). Even when the resin 110 is scattered during laser irradiation, the scattered resin 110 is prevented from adhering to the surface (11*a*) of the insulating layer 11. Then, the openings (13*a*) penetrating the insulating layer 11 and the protective film (PF) are formed.

The inner wall surfaces (13*b*) of the insulating layer 11 are formed by the resin 110 and inorganic particles 53 protruding from the resin 110 among the inorganic particles 5. By irradiating the insulating layer 11 with a laser, some of the first inorganic particles 51 embedded in the resin 110 protrude from the resin 110 and become the inorganic particles 53. The inorganic particles 53 forming the inner wall surfaces (13*b*) each include a portion protruding from the resin 110 and a portion embedded in the resin 110. In order to control a shape of the inner wall surfaces (13*b*), a predetermined treatment is performed on the inner wall surfaces (13*b*). By controlling conditions for treating the inner wall surfaces (13*b*), a size of unevenness of the inner wall surfaces (13*b*) is controlled. Preferably, the portions of the inorganic particles 53 that protrude from the resin 110 are selectively removed by the treatment.

Figure 4D:
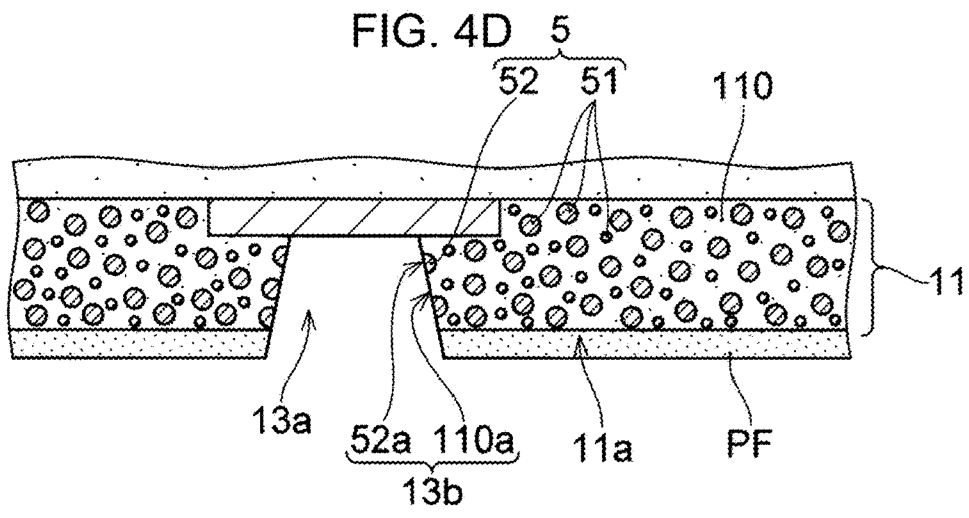
FIG. 4D is an enlarged partial cross-sectional view illustrating an example of a wiring substrate according to an embodiment of the present invention in a manufacturing process.

As a result, as illustrated in FIG. 4D, the second inorganic particles 52 having the flat parts (52*a*) are formed. For example, after laser irradiation, the second inorganic particles 52 are formed by treating the inner wall surfaces (13*b*) of the insulating layer 11 with a chemical. For example, the inner wall surfaces (13*b*) are treated using an etching solution that has a higher etching rate for the inorganic particles 5 than for the resin 110. As an example, a permanganate solution is used.

Or, the second inorganic particles 52 may be formed by treating the inner wall surfaces (13*b*) with a plasma gas. By controlling conditions of a plasma treatment, the shape of the inner wall surfaces (13*b*) can be controlled. As some examples, the etching rate of the inorganic particles 5 and the etching rate of the resin 110 are controlled by adjusting conditions such as temperature, concentration, time, type and pressure of a plasma gas. For example, a plasma gas such as argon, methane tetrafluoride, a mixture of methane tetrafluoride and oxygen, or sulfur hexafluoride is used.

That is, some of the spherical first inorganic particles 51 protrude into the openings (13*a*) to become the inorganic particles 53 (refer to FIG. 4C) due to the formation of the openings (13*a*) by laser irradiation, and the protruding portions are cut flat by the appropriate treatment described above. As will be described later, when a first metal film (12*a*) (see FIG. 4E) as a seed layer is formed, for example by sputtering on the inner wall surfaces (13*b*) of the insulating layer 11 in a subsequent process, the protruding portions of the inorganic particles 53 may impede growth of the sputtering film. It may be possible that a continuous seed layer is not formed on the inner wall surfaces (13*b*), or a thick seed layer is required, making it impossible to form fine wirings. Therefore, the protruding portions of the inorganic particles 53 are removed, and the second inorganic particles 52 having the flat parts (52*a*) are formed. The flat parts (52*a*) forming the inner wall surfaces (13*b*) and the surfaces (110*a*) of the resin 110 are substantially flush with each other. Smooth inner wall surfaces (13*b*) without unevenness are obtained.

The treatment of the inner wall surfaces (13*b*) is performed while the surface (11*a*) of the insulating layer 11 is protected by the protective film (PF). Therefore, the surface (11*a*) of the insulating layer 11 is unlikely to be eroded, for example, by a chemical or a plasma gas during the treatment of the inner wall surfaces (13*b*).

After treating the inner wall surfaces (13*b*) of the insulating layer 11, insides of the openings (13*a*) are cleaned when necessary. By cleaning the insides of the openings (13*a*), resin residues generated during the formation of the openings (13*a*) are removed. That is, the cleaning can include a desmear treatment. The cleaning of the insides of the openings (13*a*) is performed, for example, by a plasma treatment. That is, the cleaning may be performed with a dry process. The surface (11*a*) of the insulating layer 11 is covered by the protective film (PF), and thus is not affected by the plasma treatment. Therefore, at this point, no unevenness is formed on the surface (11*a*) of the insulating layer 11. The surface (11*a*) is not roughened. When the insides of the openings (13*a*) are sufficiently cleaned by the treatment of the inner wall surfaces (13*b*) in the preceding process, the cleaning of the insides of the openings (13*a*) after the treatment of the inner wall surfaces (13*b*) can be omitted.

After the cleaning of the insides of the openings (13*a*) (or after the treatment of the inner wall surfaces (13*b*) when the cleaning of the insides of the openings (13*a*) is omitted), the protective film (PF) is removed from the insulating layer 11. As described above, the surface (11*a*) of the insulating layer 11 is not affected by the chemical or plasma gas used for cleaning the insides of the openings (13*a*) or treating the inner wall surfaces (13*b*). Therefore, the surface (11*a*) after removing the protective film (PF) is flat. The flat surface (11*a*) is cleaned when necessary. As an example, the surface (11*a*) is dry etched. The dry etching is performed, for example, by sputtering using an argon gas (argon sputtering). A release agent and/or an adhesive (not illustrated) interposed between the protective film (PF) and the insulating layer 11 may be removed.

Figure 4E:
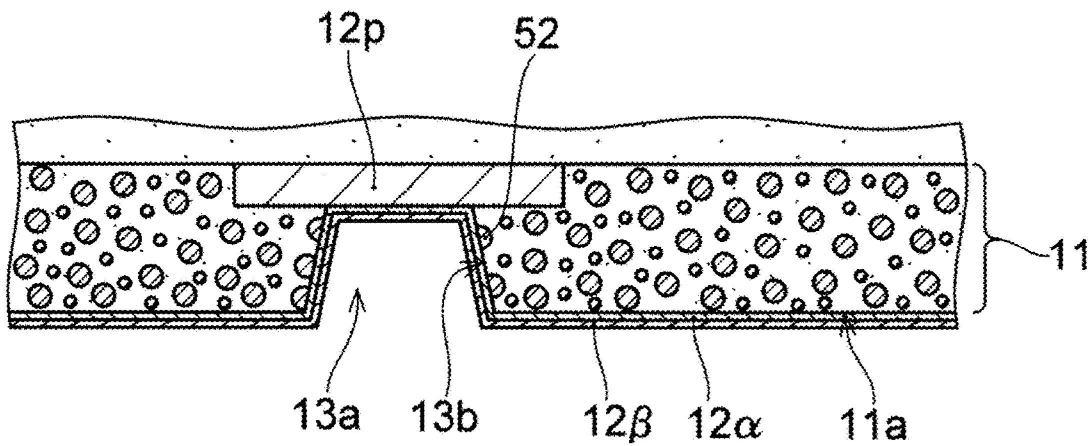
FIG. 4E is an enlarged partial cross-sectional view illustrating an example of a wiring substrate according to an embodiment of the present invention in a manufacturing process.

As illustrated in FIG. 4E, a first metal film (12α) is formed all over the inner wall surfaces (13*b*) of the insulating layer 11, the exposed surfaces of the component mounting pads (12*p*), and the surface (11*a*) of the insulating layer 11. Further, a second metal film (12β) is formed on the first metal film (12α). The exposed surfaces of the second inorganic particles 52 on the inner wall surfaces (13*b*) of the insulating layer 11 are covered by the first metal film (12α). The first metal film (12α) and second metal film (12B) function as a seed layer when a third metal film (12γ) (see FIG. 4G) is formed by electrolytic plating in a subsequent process. The first metal film (12α) and second metal film (12B) may be formed by electroless plating, but are preferably formed by sputtering. In particular, when the first metal film (12α) is formed by sputtering, high adhesion strength between the insulating layer 11 and the first metal film (12α) can be obtained.

Further, since no unevenness is formed on the inner wall surfaces (13*b*) of the insulating layer 11 and the surface (11*a*) of the insulating layer 11 is flat, a thin but continuous first metal film (12α) can be formed by sputtering. For example, a first metal film (12α) having a thickness of 0.01 μm or more and 0.5 μm or less, and a second metal film (12β) having a thickness of 0.01 μm or more and 0.9 μm or less are formed.

A part of the first metal film (12α) can become the first metal layer 121 (see FIG. 2) forming the conductor layer 12 formed on the insulating layer 11. A part of the second metal film (12β) can become the second metal layer 122 (see FIG. 2), which together with the first metal layer 121 forms the conductor layer 12. Therefore, the first metal film (12α) is formed of an alloy containing copper and an element other than copper, which is described above as a material for the first metal layer 121. Further, the second metal film (12β) is formed either of substantially pure copper, or of a copper alloy different from the copper alloy used to form the first metal film (12α), as described above as a material for the second metal layer 122.

Figure 4F:
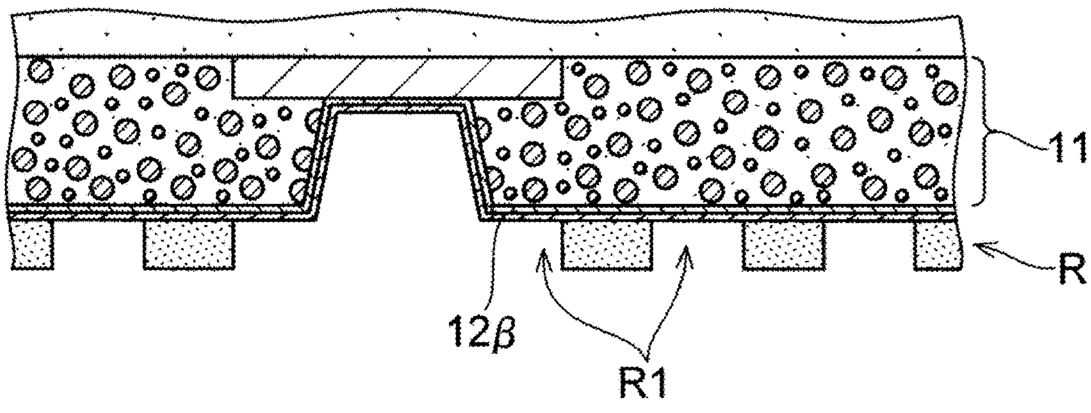
FIG. 4F is an enlarged partial cross-sectional view illustrating an example of a wiring substrate according to an embodiment of the present invention in a manufacturing process.

As illustrated in FIG. 4F, a plating resist (R) having openings (R1) is provided on the second metal film (12β). The plating resist (R) is formed, for example, by laminating a dry film on the second metal film (12β), and the openings (R1) are formed, for example, by photolithography. The openings (R1) are formed in patterns corresponding to the conductor patterns to be included in a conductor layer 12 (see FIG. 4J) formed on the insulating layer 11. Wirings such as the wirings (12*w*) (see FIG. 2) included in the conductor layer 12, as described above, may have wiring widths of 3 μm or less. The openings (R1) are formed to have opening widths corresponding to wiring widths of conductor patterns such as the wirings (12*w*) to be formed in the openings (R1). Further, as described above, the wirings of the conductor layer 12 may have an aspect ratio of 2.0 or more and 4.0 or less. Therefore, preferably, a plating resist (R) is formed having a thickness (height) equal to or larger than a thickness (height) of wirings that satisfy the aspect ratio that the wirings to be formed should have.

Figure 4G:
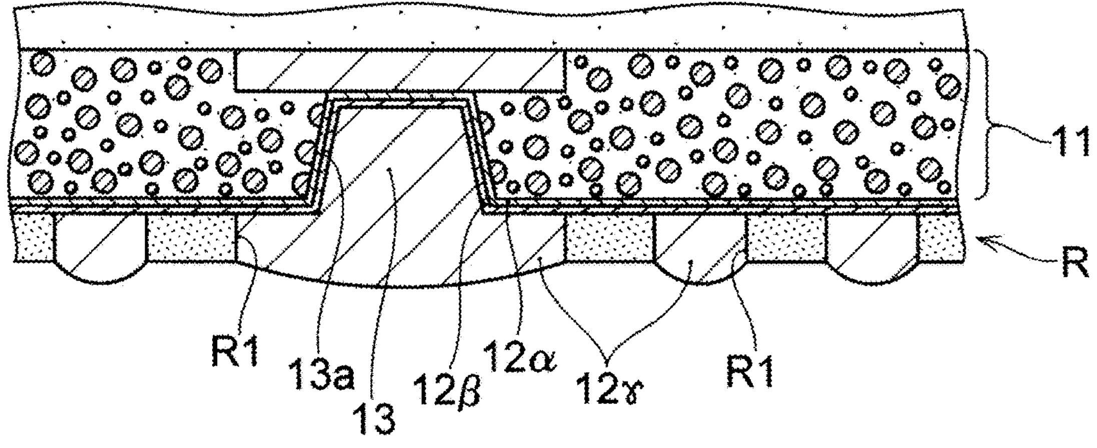
FIG. 4G is an enlarged partial cross-sectional view illustrating an example of a wiring substrate according to an embodiment of the present invention in a manufacturing process.

As illustrated in FIG. 4G, a third metal film (12γ) formed of, for example, substantially copper is formed in the openings (R1) of the plating resist (R) by electrolytic plating using the first metal film (12α) and second metal film (12β) as a power feeding layer. A part of the third metal film (12γ) can become the third metal layer 123 (see FIG. 2) forming the conductor layer 12 formed on the insulating layer 11. Via conductors 13 are formed in the openings (13*a*) of the insulating layer 11. As in the example of FIG. 4G, the third metal film (12γ) may be formed to completely fill the openings (R1) and further have a curved surface protruding beyond a surface (lower surface) of the plating resist (R). It may be possible that wirings having desired thicknesses and aspect ratios may be more reliably formed.

Figure 4H:
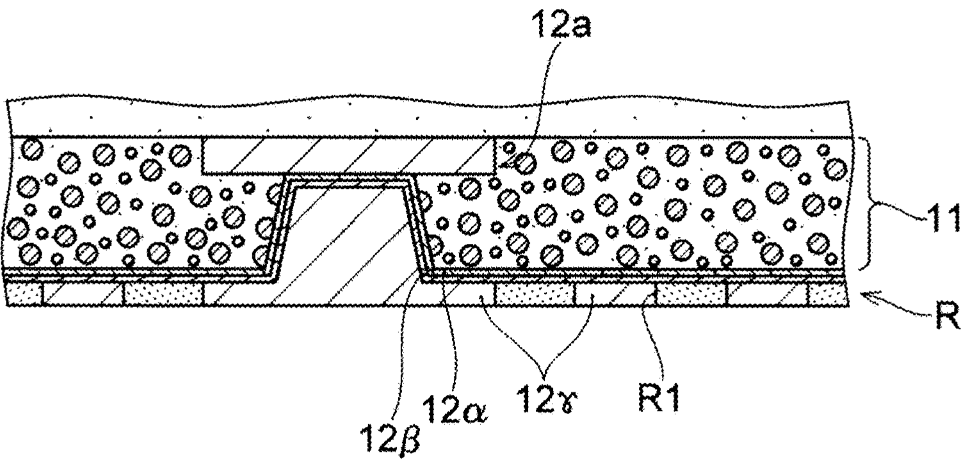
FIG. 4H is an enlarged partial cross-sectional view illustrating an example of a wiring substrate according to an embodiment of the present invention in a manufacturing process.

As illustrated in FIG. 4H, a portion on a lower surface (surface on the opposite side with respect to the conductor layer (12*a*)) side of the third metal film (12γ) is removed by polishing. At least a protruding portion of the third metal film (12γ) from a lower surface of the plating resist (R) is removed. The third metal film (12γ) is polished until a total thickness of the third metal film (12γ) and the first metal film (12α) and second metal film (12β) reaches a thickness required for the conductor layer 12 (see FIG. 4J) to be formed on the insulating layer 11, for example, a thickness of 7 μm or less. As in the example of FIG. 4H, a lower-surface side portion of the plating resist (R) may also be removed together with the portion of the third metal film (12γ). The polishing of the third metal film (12γ) is performed, for example, using any method such as chemical mechanical polishing (CMP). As a result of the polishing, the lower surface of the third metal film (12γ) can have an arithmetic mean roughness of 0.3 μm or less.

After the polishing of the third metal film (12γ), the plating resist (R) is removed. Then, a portion of the second metal film (12β) not covered by the third metal film (12γ) is selectively removed by quick etching or the like, and further, a portion of the first metal film (12α) exposed from the second metal film (12β) is selectively removed, for example, by quick etching or the like.

When the first metal film (12α) and second metal film (12β) are formed by sputtering, a surface state of a film, such as the number of crystal defects, can be controlled by condition settings, such as a temperature during sputtering and a pressure of a rare gas that collides with a target. Therefore, by selecting sputtering conditions, it is possible to form the first metal film (12α) and second metal film (12β) having porous surfaces that are more easily etched than the third metal film (12γ) formed by electrolytic plating. Then, a larger amount of the first metal film (12α) and second metal film (12β) formed under such conditions can be dissolved and removed by quick etching compared to a dissolution amount of the third metal film (12γ). Further, the first metal film (12α) and the second metal film (12β) are formed of at least mutually different copper alloys, or the first metal film (12α) is formed of a copper alloy and the second metal film (12β) is formed of substantially pure copper. Therefore, an etching solution having a higher etching rate for the second metal film (12β) than for the first metal film (12α), for example, an etching solution having a higher etching rate for pure copper than for a copper alloy, is used. By selecting such an etching solution, a larger amount of the second metal film (12β) can be dissolved compared to a dissolution amount of the first metal film (12α).

Figure 4I:
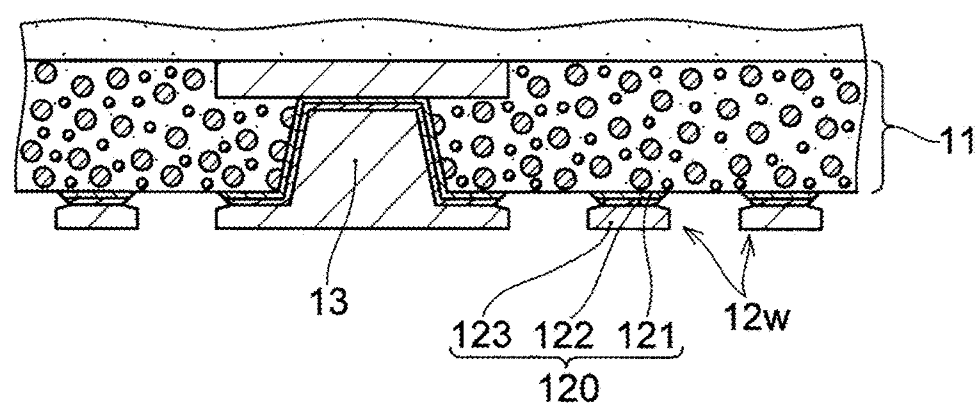
FIG. 4I is an enlarged partial cross-sectional view illustrating an example of a wiring substrate according to an embodiment of the present invention in a manufacturing process.

As a result of the selective removal of the first and second metal films (12α, 12β), as illustrated in FIG. 4I, individually separated conductor patterns 120 such as the wirings (12*w*) and the via pads of the via conductors 13 are obtained. The conductor patterns 120 include the first metal layer 121, the second metal layer 122, and the third metal layer 123, which are sequentially laminated from the insulating layer 11 side. The first metal layer 121 and the second metal layer 122 are respectively formed of remaining portions of the first metal film (12α) and the second metal film (12β) (see FIG. 4H) after the above-described selective removal. The third metal layer 123 is formed of the third metal film (12γ) remaining after a part of the third metal film (12γ) (see FIG. 4H) is removed by the above-described polishing.

As described above, by appropriately selecting the conditions for forming the first metal film (12α) and second metal film (12β), which are formed by sputtering for example, the third metal layer 123 can be formed having a larger width than the widths of the first metal layer 121 and second metal layer 122. Further, as described above, by appropriately selecting an etching solution for the selective removal of the first metal film (12α) and second metal film (12β) by quick etching, the first metal layer 121 having a width larger than that of the second metal layer 122 can be formed.

Figure 4J:
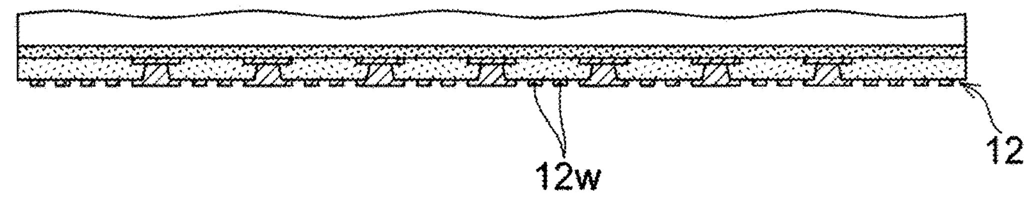
FIG. 4J is a cross-sectional view illustrating an example of a wiring substrate according to an embodiment of the present invention in a manufacturing process.

As illustrated in FIG. 4J, the conductor layer 12 including predetermined conductor patterns such as the wirings (12*w*) separated from each other is obtained. In FIG. 4J, similar to FIG. 1, the conductor layer 12 is illustrated as having only one layer. However, the conductor layer 12 is formed of the first metal layer 121, the second metal layer 122, and the third metal layer 123 as illustrated in FIG. 4I.

Figure 4K:
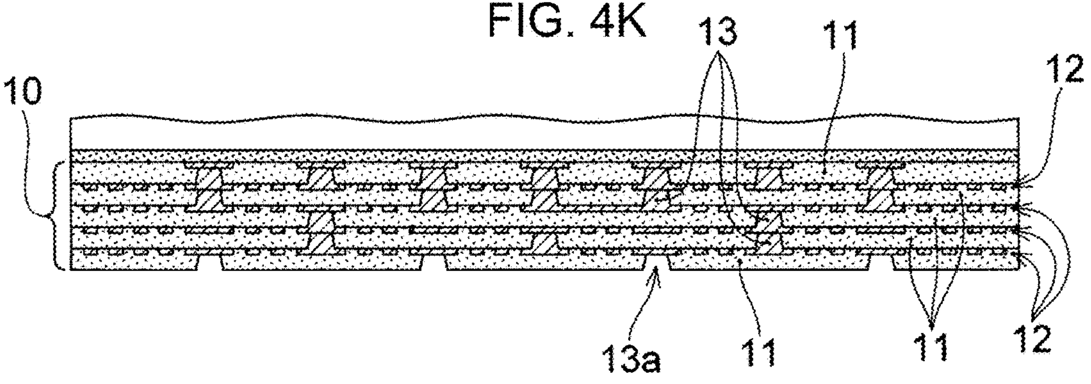
FIG. 4K is a cross-sectional view illustrating an example of a wiring substrate according to an embodiment of the present invention in a manufacturing process.

As illustrated in FIG. 4K, on the insulating layer 11 and conductor layer 12 formed through the processes up to FIG. 4J, three more sets of the insulating layer 11 and conductor layer 12, as well as via conductors 13, are further formed using a method similar to the method described with reference to FIGS. 4B-4I. Then, on the laminate of the conductor layers 12 and insulating layers 11 formed in this way, an insulating layer 11 is further laminated using the same method as the other insulating layers 11, and openings (13*a*) penetrating the insulating layer 11 are formed by laser irradiation or the like. The first build-up part 10 is completed.

Figure 4L:
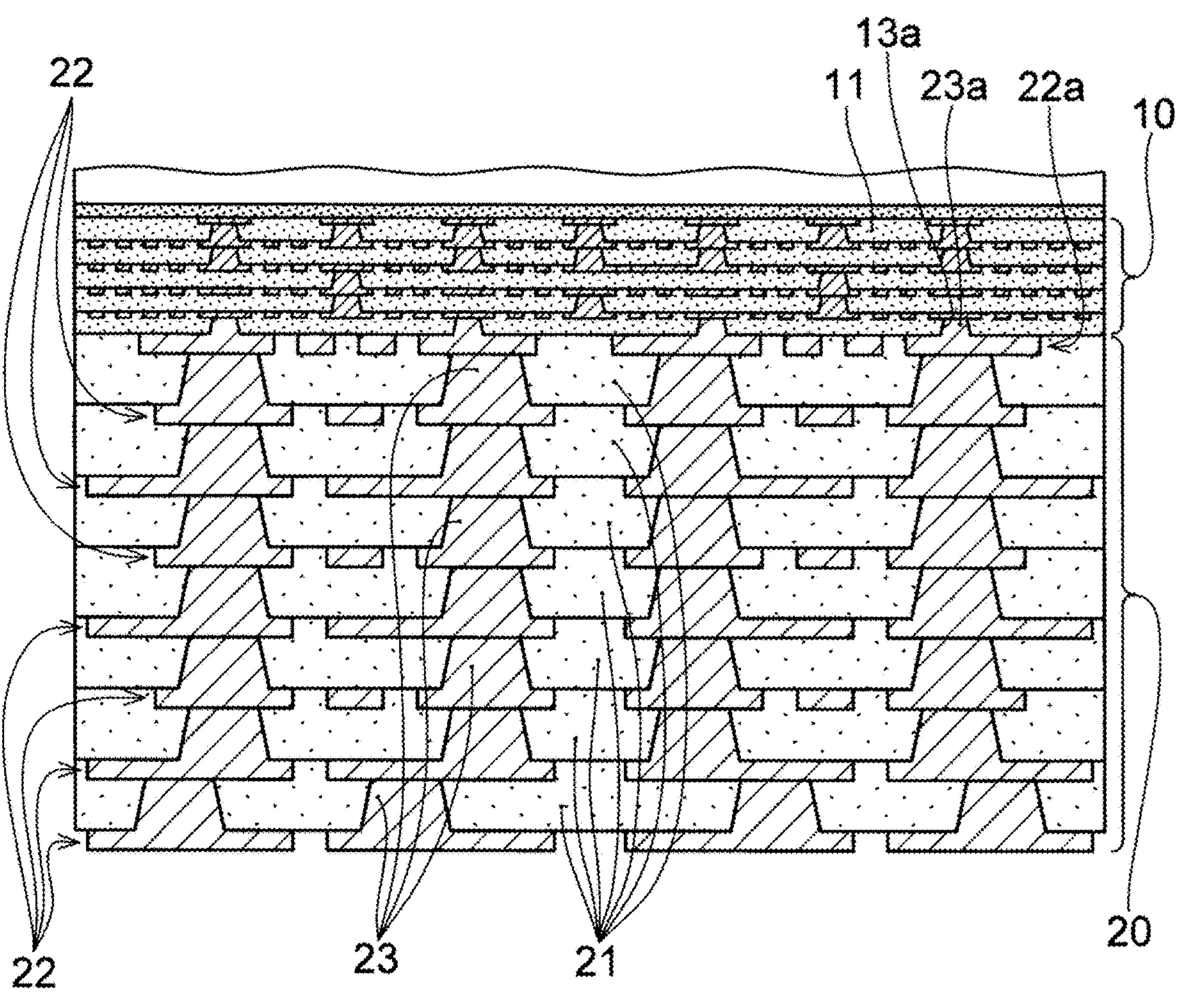
FIG. 4L is a cross-sectional view illustrating an example of a wiring substrate according to an embodiment of the present invention in a manufacturing process.

As illustrated in FIG. 4L, on the lower side of the first build-up part 10, the conductor layer (22*a*) is formed and the via conductors (23*a*) are formed in the openings (13*a*). Further, by repeating formation of an insulating layer 21, a conductor layer 22, and via conductors 23, the second build-up part 20 is formed. The conductor layer (22*a*), the conductor layers 22, the via conductors (23*a*), and the via conductors 23 are formed using any method for forming conductor layers and via conductors, such as a semi-additive method. The insulating layers 21 each can be formed by laminating and thermocompression bonding a film-like resin, similar to the method for forming the insulating layers 11.

Figure 4M:
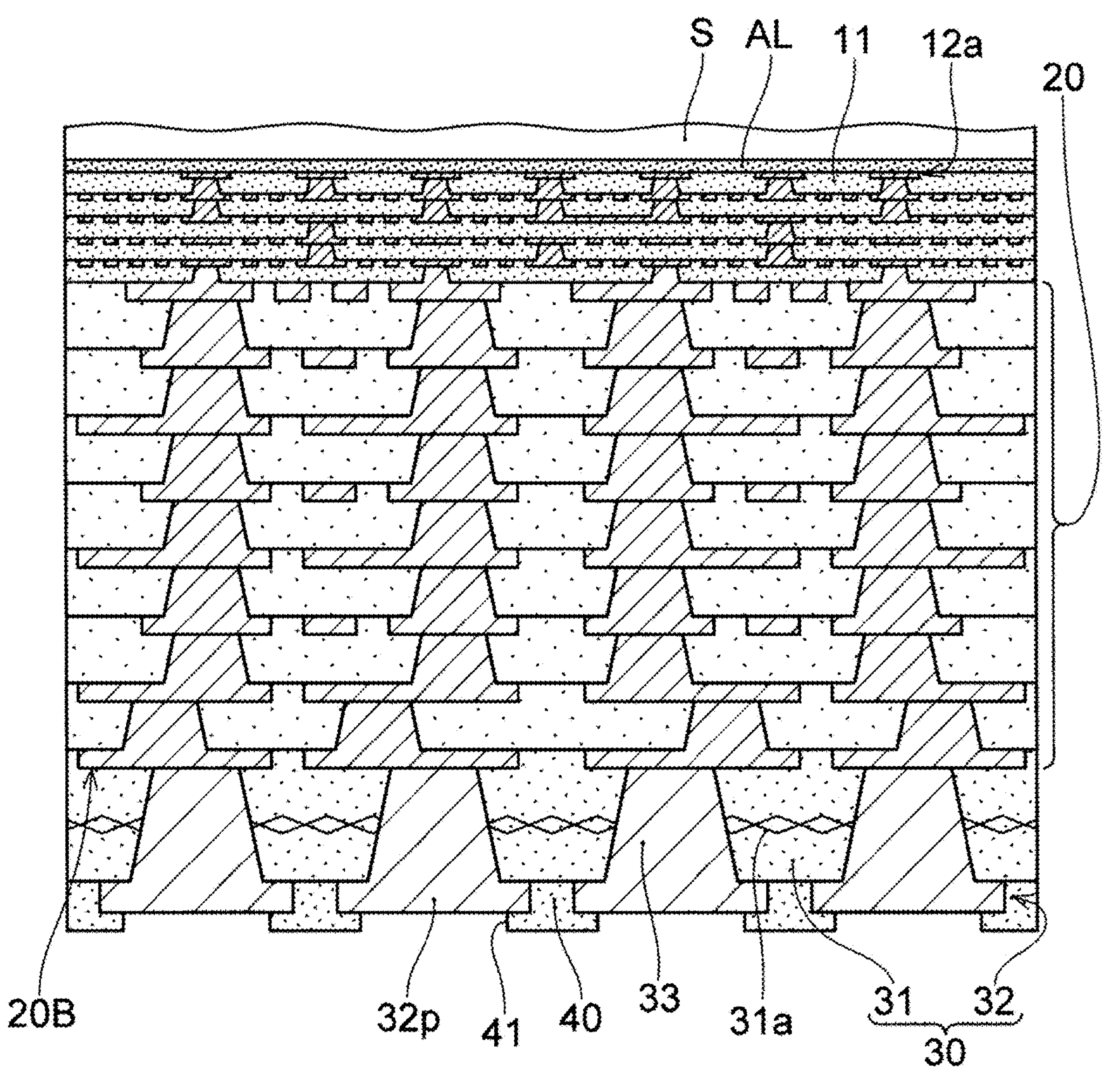
FIG. 4M is a cross-sectional view illustrating an example of a wiring substrate according to an embodiment of the present invention in a manufacturing process.

As illustrated in FIG. 4M, on the surface (second surface (20B)) of the second build-up part 20 on the opposite side with respect to the support substrate(S) side, the insulating layer 31, the conductor layer 32, and the via conductors 33 penetrating the insulating layer 31, of the third build-up part 30, are formed. The insulating layer 31 in FIG. 4M is formed by laminating and thermocompression bonding a prepreg containing an insulating resin such as an epoxy resin impregnated with a core material (31*a*) formed of a glass fiber or the like. Similar to the insulating layers 21, the insulating layer 31 may be formed by thermocompression bonding of a film-like resin. Similar to the method for forming the conductor layers 22 and via conductors 23, the conductor layer 32 and via conductors 33 may be formed, for example, using a semi-additive method, or using any other method for forming a conductor layer such as a subtractive method. The formation of the third build-up part 30 is completed.

Further, the solder resist 40 is formed by forming a photosensitive epoxy resin film or a polyimide resin film on the surfaces of the insulating layer 31 and the conductor layer 32. Then, the openings 41 defining the conductor pads (32*p*) are formed by photolithography.

After that, the support substrate(S) is removed. For example, laser is irradiated onto the adhesive layer (AL), and after the adhesive layer (AL) is softened, the support substrate(S) is peeled off from the conductor layer (12*a*) and the insulating layer 11. The upper surface of the conductor layer (12*a*) and the upper surface of the insulating layer 11 are exposed. When any adhesive layer (AL) remains, the remaining adhesive layer (AL) is removed using an appropriate solvent. The wiring substrate 1 illustrated in FIG. 1 is completed.

A wiring substrate according to an embodiment of the present invention is not limited to those having the structures illustrated in the drawings and those having the structures, shapes, and materials exemplified herein. As described above, the build-up parts included in the wiring substrate of the embodiment can each have any number of insulating layers and conductor layers. Further, the wiring substrate of the present embodiment does not necessarily include the third build-up part. It is also possible that the outermost insulating layer and conductor layer on the opposite side with respect to the component mounting surface of the wiring substrate of the embodiment are not respectively formed thicker than the insulating layers and conductor layers in the second build-up part, and it is also possible that the outermost insulating layer on the opposite side with respect to the component mounting surface of the wiring substrate does not include a core material. It is also possible that the inorganic particles contained in the insulating layers of the first build-up part do not include the inorganic particles that form the inner wall surfaces exposed to the openings of the insulating layer, such as the second inorganic particles.

In a wiring substrate manufactured using the method described in Japanese Patent Application Laid-Open Publication No. 2005-5341, there is a concern that loss of a wiring may occur due to a decrease in contact area between an insulating layer and a seed layer caused by undercutting.

A wiring substrate according to an embodiment of the invention has a first surface and a second surface on opposite side with respect to the first surface and includes: a first build-up part that includes laminated insulating layer and conductor layer; and a second build-up part that includes laminated insulating layer and conductor layer. The first build-up part is laminated on the first surface side of the second build-up part. A minimum wiring width of wirings included in the conductor layer of the first build-up part is smaller than a minimum wiring width of wirings included in the conductor layer of the second build-up part. A minimum inter-wiring distance of the wirings included in the conductor layer of the first build-up part is smaller than a minimum inter-wiring distance of the wirings included in the conductor layer of the second build-up part. A conductor pattern included in the conductor layer of the first build-up part includes a first metal layer, a second metal layer laminated on the second surface side of the first metal layer, and a third metal layer laminated on the second surface side of the second metal layer. In a cross section of the conductive pattern along a lamination direction of the first build-up part and the second build-up part, a width of the first metal layer is larger than a width of the second metal layer, and a width of the third metal layer is larger than the width of the first metal layer.

According to an embodiment of the present invention, it may be possible that, in a wiring substrate that includes multiple conductor layers with different wiring densities, adhesion between an insulating layer and a conductor layer is improved and loss of a wiring is suppressed.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:

a first build-up part comprising an insulating layer and a conductor layer; and a second build-up part comprising an insulating layer and a conductor layer and formed such that the first build-up part is laminated on the second build-up part, a minimum wiring width of wirings in the conductor layer of the first build-up part is smaller than a minimum wiring width of wirings in the conductor layer of the second build-up part, and a minimum inter-wiring distance of the wirings in the conductor layer of the first build-up part is smaller than a minimum inter-wiring distance of the wirings in the conductor layer of the second build-up part, wherein the first build-up part is formed such that the conductor layer includes a conductor pattern comprising a first metal layer, a second metal layer laminated on the first metal layer, and a third metal layer laminated on the second metal layer, a width of the first metal layer is larger than a width of the second metal layer, and a width of the third metal layer is larger than the width of the first metal layer, and the conductor layer in the first build-up part is formed such that a width of the conductor pattern is smallest at a boundary portion between the second metal layer and the third metal layer.

2. The wiring substrate according to claim 1, wherein the conductor layer in the first build-up part is formed such that the third metal layer of the conductor pattern includes an electrolytic plating film and that each of the first metal layer and the second metal layer includes a seed layer comprising a sputtering film.

3. The wiring substrate according to claim 1, wherein the conductor layer in the first build-up part is formed such that the minimum wiring width of the wirings is 3 μm or less and that the minimum inter-wiring distance of the wirings is 3 μm or less.

4. The wiring substrate according to claim 1, wherein the conductor layer in the first build-up part is formed such that an aspect ratio of the wirings is in a range of 2.0 to 4.0.

5. The wiring substrate according to claim 1, wherein the first build-up part is formed such that the conductor layer has a polished surface.

6. The wiring substrate according to claim 1, further comprising:

a third build-up part laminated on the second build-up part on an opposite side with respect to the first build-up part and comprising an insulating layer, a conductor layer and a via conductor.

7. The wiring substrate according to claim 6, wherein the third build-up part is formed such that the insulating layer includes a core material.

8. The wiring substrate according to claim 1, wherein the first build-up part has a surface configured to mount a component.

9. The wiring substrate according to claim 1, wherein the first build-up part is formed such that the insulating layer has a surface having an arithmetic mean roughness Ra in a range of 0.02 μm to 0.06 μm.

10. A wiring substrate, comprising:

a first build-up part comprising an insulating layer and a conductor layer; and a second build-up part comprising an insulating layer and a conductor layer and formed such that the first build-up part is laminated on the second build-up part, a minimum wiring width of wirings in the conductor layer of the first build-up part is smaller than a minimum wiring width of wirings in the conductor layer of the second build-up part, and a minimum inter-wiring distance of the wirings in the conductor layer of the first build-up part is smaller than a minimum inter-wiring distance of the wirings in the conductor layer of the second build-up part, wherein the first build-up part is formed such that the conductor layer includes a conductor pattern comprising a first metal layer, a second metal layer laminated on the first metal layer, and a third metal layer laminated on the second metal layer, a width of the first metal layer is larger than a width of the second metal layer, and a width of the third metal layer is larger than the width of the first metal layer, and the conductor pattern of the conductor layer in the first build-up part is formed such that a side surface of the third metal layer has a tapered portion that is more inclined toward an inner side of the conductor pattern on a second metal layer side and that inclination of the tapered portion from a surface of the insulating layer is smaller than inclination of a side surface of the first metal layer and the second metal layer from the surface of the insulating layer.

11. A wiring substrate, comprising:

a first build-up part comprising an insulating layer and a conductor layer; and a second build-up part comprising an insulating layer and a conductor layer and formed such that the first build-up part is laminated on the second build-up part, a minimum wiring width of wirings in the conductor layer of the first build-up part is smaller than a minimum wiring width of wirings in the conductor layer of the second build-up part, and a minimum inter-wiring distance of the wirings in the conductor layer of the first build-up part is smaller than a minimum inter-wiring distance of the wirings in the conductor layer of the second build-up part, wherein the first build-up part is formed such that the conductor layer includes a conductor pattern comprising a first metal layer, a second metal layer laminated on the first metal layer, and a third metal layer laminated on the second metal layer, a width of the first metal layer is larger than a width of the second metal layer, and a width of the third metal layer is larger than the width of the first metal layer, and the first build-up part is formed such that the insulating layer includes resin and inorganic particles and that the inorganic particles includes inorganic particles having sizes of 1.0 μm or less and at least partially positioned beyond an outer edge of the third metal layer toward the first metal layer and the second metal layer.

12. The wiring substrate according to claim 1, wherein the conductor pattern of the conductor layer in the first build-up part is formed such that the first metal layer includes an alloy comprising copper and an element other than copper and that the second metal layer is formed of substantially pure copper.

13. The wiring substrate according to claim 12, wherein the first metal layer in the conductor pattern is formed such that a weight of the copper in the alloy is 90% or more of a total weight of the alloy.

14. The wiring substrate according to claim 1, wherein the conductor pattern of the conductor layer in the first build-up part is formed such that a total thickness of the first metal layer and the second metal layer is in a range of 0.02 μm to 1 μm.

15. The wiring substrate according to claim 1, wherein the conductor pattern of the conductor layer in the first build-up part is formed such that a thickness of the first metal layer is in a range of 0.01 μm to 0.5 μm.

16. The wiring substrate according to claim 2, wherein the conductor layer in the first build-up part is formed such that the minimum wiring width of the wirings is 3 μm or less and that the minimum inter-wiring distance of the wirings is 3 μm or less.

17. The wiring substrate according to claim 2, wherein the conductor layer in the first build-up part is formed such that an aspect ratio of the wirings is in a range of 2.0 to 4.0.

18. The wiring substrate according to claim 2, wherein the first build-up part is formed such that the conductor layer has a polished surface.

19. The wiring substrate according to claim 2, further comprising:

a third build-up part laminated on the second build-up part on an opposite side with respect to the first build-up part and comprising an insulating layer, a conductor layer and a via conductor.

20. The wiring substrate according to claim 10, wherein the conductor layer in the first build-up part is formed such that the third metal layer of the conductor pattern includes an electrolytic plating film and that each of the first metal layer and the second metal layer includes a seed layer comprising a sputtering film.

* * * * *